(12) United States Patent
Jun et al.

(10) Patent No.: US 9,066,449 B2
(45) Date of Patent: Jun. 23, 2015

(54) AIR FILTRATION AND VISUAL BARRIER FOR ENCLOSURE WITH FRONT-TO-BACK AIRFLOW

(71) Applicant: Cisco Technology, Inc., San Jose, CA (US)

(72) Inventors: Frank S. Jun, San Jose, CA (US); Hong Tran Huynh, Fremont, CA (US); Vic Hong Chia, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 30 days.

(21) Appl. No.: 13/967,751

(22) Filed: Aug. 15, 2013

(65) Prior Publication Data

US 2014/0345238 A1    Nov. 27, 2014

Related U.S. Application Data

(60) Provisional application No. 61/826,646, filed on May 23, 2013.

(51) Int. Cl.
| | |
|---|---|
| *B01D 46/00* | (2006.01) |
| *H05K 7/20* | (2006.01) |
| *B01D 46/28* | (2006.01) |

(52) U.S. Cl.
CPC ........ *H05K 7/20718* (2013.01); *B01D 46/0004* (2013.01); *B01D 46/28* (2013.01); *Y10T 29/49817* (2015.01)

(58) Field of Classification Search
CPC ..... H05K 5/02; H05K 7/20172; B01D 46/28; B01D 46/0004
USPC .............. 55/385.1, 385.6, 289, 295; 454/184, 454/192, 259, 353; 361/724, 361/679.47–679.53, 687, 695, 696; 62/259.2; 165/80.5, 104.22, 104.33
See application file for complete search history.

(56) References Cited

U.S. PATENT DOCUMENTS

| | | | |
|---|---|---|---|
| 7,064,957 B1 | 6/2006 | Liang et al. | |
| D549,089 S | 8/2007 | Jun et al. | |
| 7,534,167 B2 * | 5/2009 | Day | 454/187 |
| 7,537,517 B1 * | 5/2009 | Meserth et al. | 454/184 |
| 7,656,660 B2 * | 2/2010 | Hoeft et al. | 361/679.51 |
| 7,826,216 B2 * | 11/2010 | Moss | 361/679.49 |
| 8,189,348 B2 | 5/2012 | Kadivar et al. | |
| 8,270,171 B2 | 9/2012 | Narasimhan et al. | |
| 8,403,736 B2 * | 3/2013 | Rasmussen et al. | 454/184 |
| 8,435,057 B1 | 5/2013 | Jun et al. | |
| 8,456,840 B1 * | 6/2013 | Clidaras et al. | 361/695 |
| 8,591,300 B2 * | 11/2013 | Slessman et al. | 454/184 |
| 8,675,357 B2 * | 3/2014 | Namek et al. | 361/679.51 |
| 2007/0289776 A1 | 12/2007 | Liang et al. | |

(Continued)

*Primary Examiner* — Duane Smith
*Assistant Examiner* — Minh-Chau Pham
(74) *Attorney, Agent, or Firm* — Edell, Shapiro & Finnan, LLC

(57) ABSTRACT

An enclosure has a perforated front door with a replaceable filter, and a perforated rear side allowing air to flow through the enclosure. The enclosure also has mounting brackets for heat generating elements, such as line cards or other rack mounted electronics. A fan draws air through the perforated front door, though the filter, and across the heat generating elements. Side brushes are disposed on a side wall near the front of the enclosure, which allow any cables attached to the heat generating elements to exit the enclosure. The front door is removable, opening up one side of the side brushes and allowing the cables to slide in the side brushes while still connected to the heat generating elements.

20 Claims, 12 Drawing Sheets

(56) References Cited

U.S. PATENT DOCUMENTS

2011/0086589 A1* 4/2011 Skrepcinski et al. ......... 454/184
2011/0182036 A1* 7/2011 Huang et al. .................. 361/724
2014/0206273 A1* 7/2014 Larsen et al. ................. 454/184

* cited by examiner

AIR FILTRATION AND VISUAL BARRIER FOR ENCLOSURE WITH FRONT-TO-BACK AIRFLOW

CROSS REFERENCE TO RELATED APPLICATION

This application claims priority to U.S. Provisional Application No. 61/826,646, filed May 23, 2013, the entirety of which is incorporated herein by reference.

TECHNICAL FIELD

The present disclosure relates to providing airflow in data center or telecom networking enclosures.

BACKGROUND

Traditionally, most data center or telecom networking enclosures use either "90-degree turned front-to-back" or "side-to-side" airflow to cool the internal line card components. The "90-degree turned front-to-back" airflow design requires a dedicated air inlet area which is usually located on the lower front area of the enclosure. Once the air enters through this lower air intake, it needs to turn 90-degree up to go through all the vertically oriented line cards and the warm air finally exits through the rear exhaust area. The slightly simpler "side-to-side" airflow design requires perforation on both side walls of the enclosure as all line cards are placed in horizontal orientation. A fan tray is placed on one side of the enclosure to either blow or suck the air through the line cards to cool them.

In order to meet the air filtration requirement which is part of the stringent NEBS (Network Equipment Building System) industry standard, a removable foam filter is attached to the air inlet area of the enclosure. For the "90-degree turned front-to-back" enclosure design, a filter is attached on the bottom air intake area. For the "side-to-side" airflow enclosure design, a filter is attached to the side air intake area on the enclosure wall. Because the filter is placed well away from the busy line card area, it does not interfere with the line card operation or the network cable management that needs to be plugged to the line card's input/output ports. However, some of latest data center enclosures are now using the new airflow architecture design called "straight front-to-back" for the air to enter straight through the perforated line card face plates and exit through the rear fan trays. One of the key advantages of this design is that no valuable vertical or side rack space are wasted to provide the empty air baffling space for the air to turn or redirect. Still, this presents a challenge for the NEBS air filtration requirement since the entire front area of the enclosure now needs to be sealed with filters to keep dust out while still allowing the outside cables to be plugged into the line cards.

DESCRIPTION OF EXAMPLE EMBODIMENTS

Overview

Figure 1:
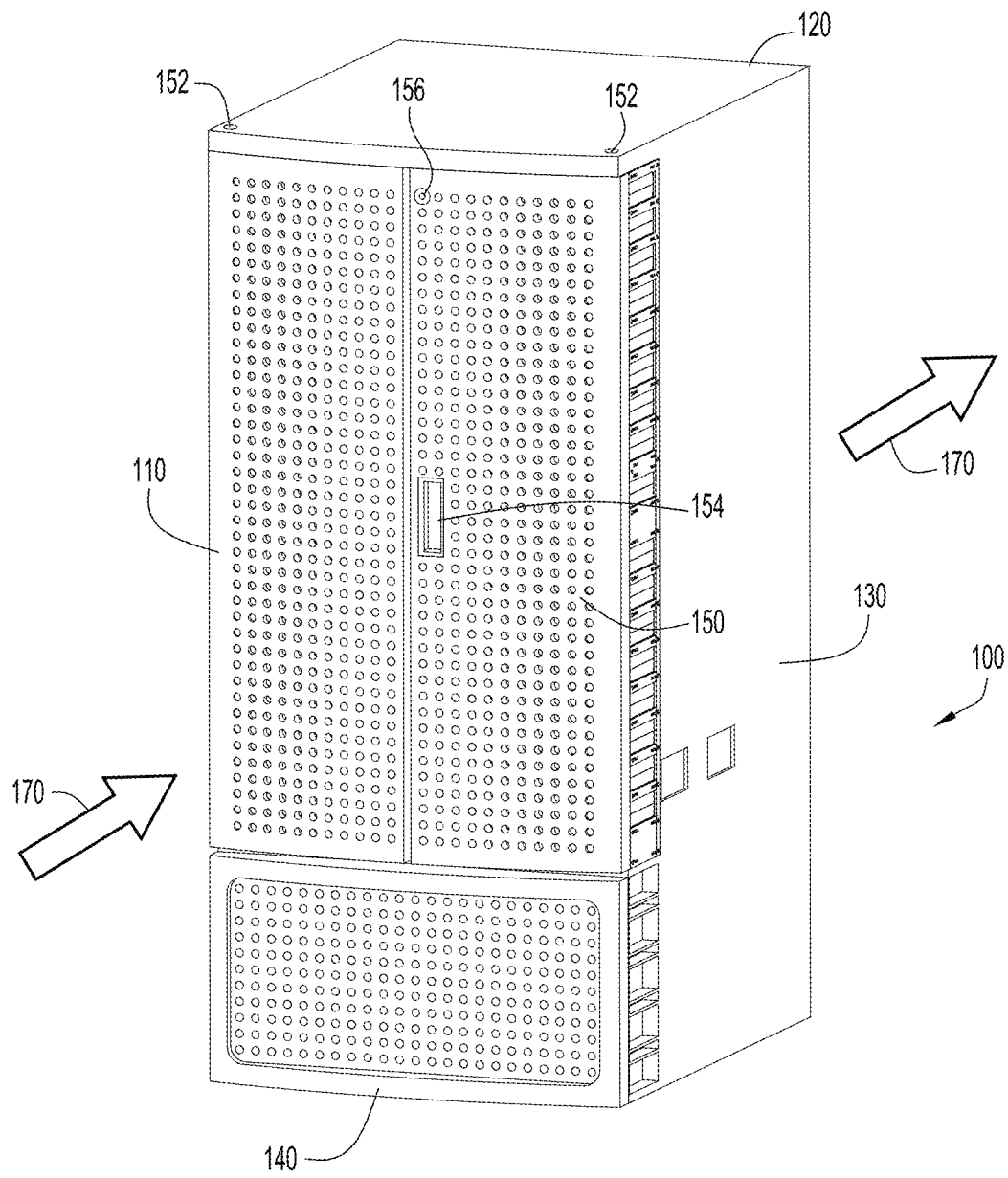
FIG. 1 illustrates an enclosure according to the embodiments presented herein, with filter doors closed.
Figure 2:
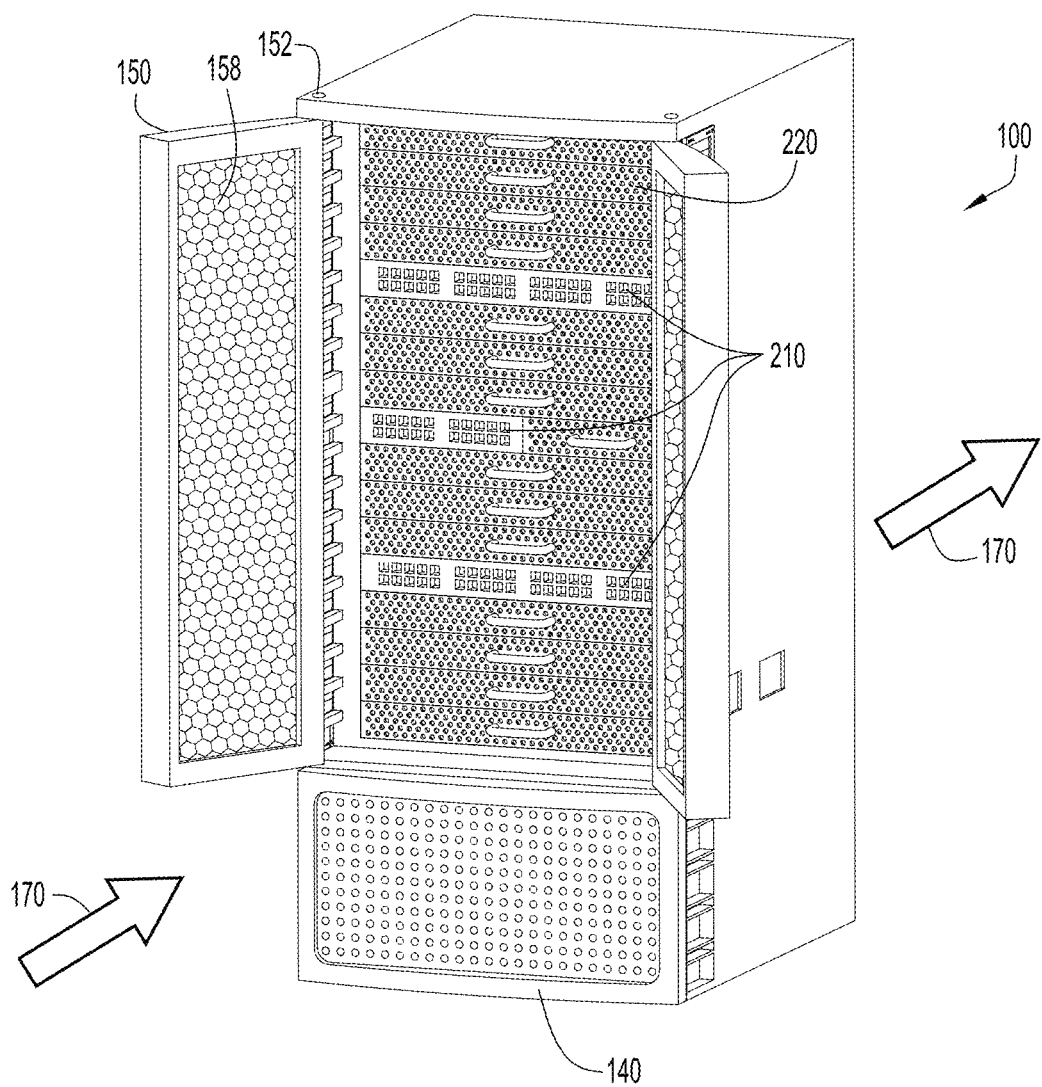
FIG. 2 illustrates the enclosure with filter doors open.

An enclosure has a perforated front door with a replaceable filter, and a perforated rear side allowing air to flow through the enclosure. The enclosure also has mounting brackets for heat generating elements, such as line cards or other rack mounted electronics. A fan draws air through the perforated front door, though the filter, and across the heat generating elements. Side brushes are disposed on a side wall near the front of the enclosure, which allow any cables attached to the heat generating elements to exit the enclosure. The front door is removable, opening up one side of the side brushes and allowing the cables to slide in the side brushes while still connected to the heat generating elements. In one example, the heat generating elements are computer and/or network equipment.

Example Embodiments

Referring first to FIGS. 1-4, one embodiment of an enclosure 100 with front 110, rear 120, and sides 130 is described. Enclosure 100 has built-in standard cable management system 160 along with dual doors 150. While enclosure 100 is shown with two doors 150, alternative embodiments may have one door or more than two doors. In one example, enclosure 100 comprises a plurality of racks for mounting electronic equipment.

Front doors 150 are opened with handle 154 and swing out on hinges 152 to provide easy access to heat generating elements 210. In one example, heat generating elements 210 are network and/or computing equipment, such as network line cards, but any electronic equipment that requires cooling may be used as heat generating elements 210. In another example, perforated blanks 220 cover the racks that do not have heat generating elements 210 in them. Perforated blanks 220 may have handles to facilitate handling and mounting to enclosure 100.

Figure 3:
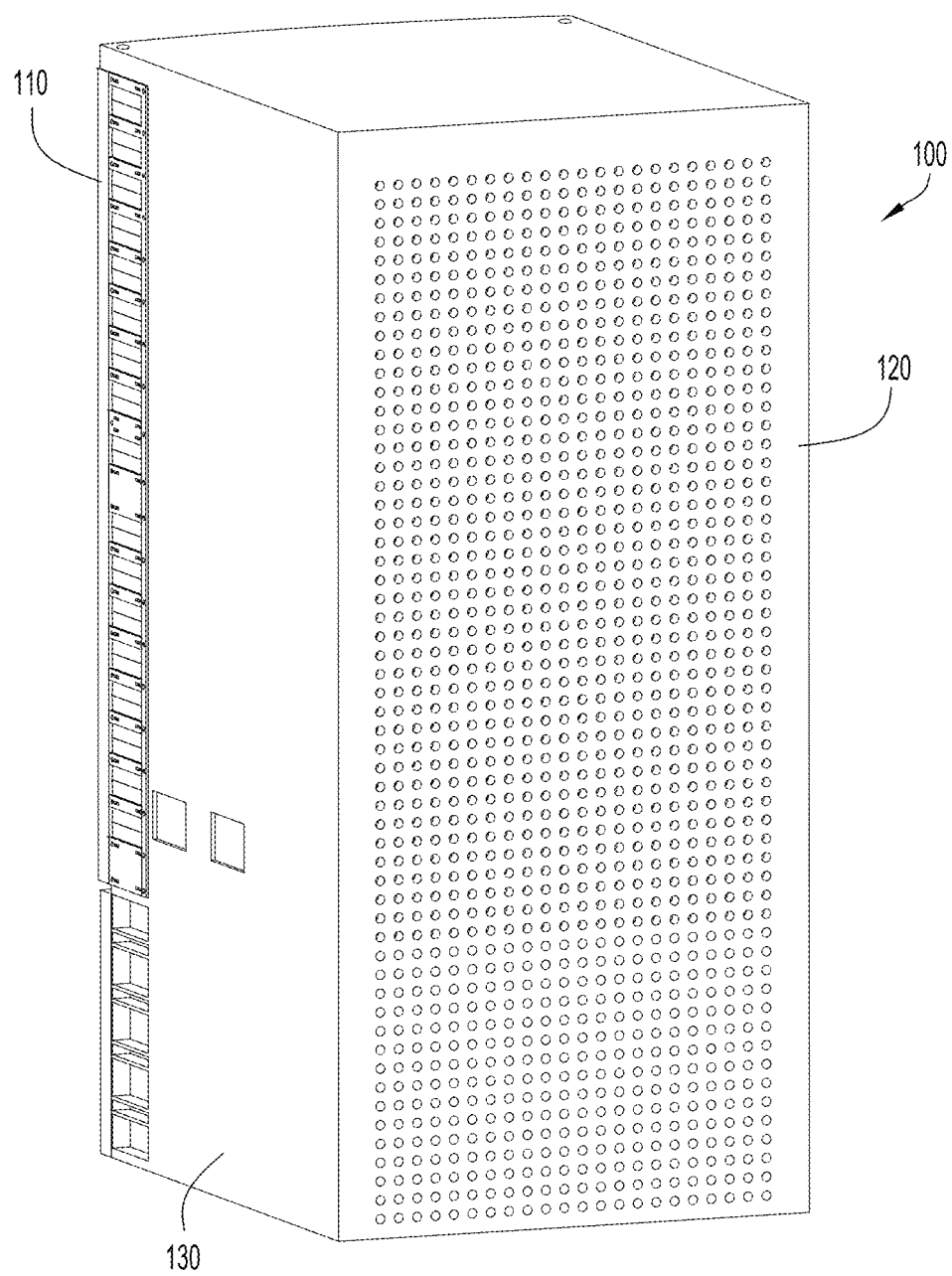
FIG. 3 is a rear view of the enclosure.
Figure 4:
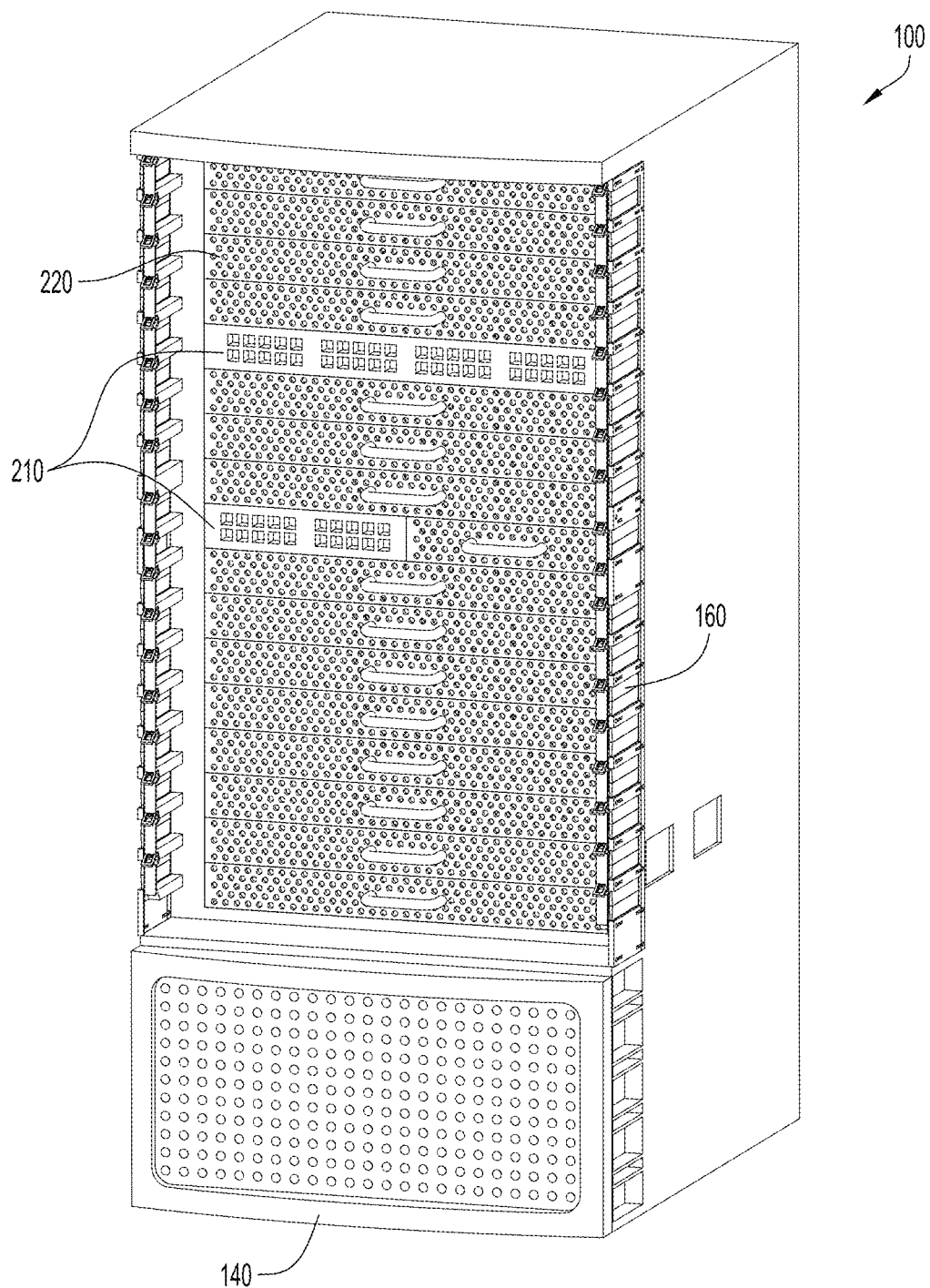
FIG. 4 is a view of the enclosure with filter doors removed.

Air flows in the direction of arrow 170 through perforations in front doors 150 and the enclosure rear 120 (show in FIG. 3). Perforations in line cards 210 and blanks 220 permit flow through the interior of enclosure 100. Air flow 170 may be forced by at least one fan that is coupled to enclosure 100. In another example, the fan is external to enclosure 100, but is directed to move air from the front of enclosure 100 in the direction of arrow 170. Front doors 150 may optionally be secured with lock 156 to prevent unauthorized entry into enclosure 100.

Enclosure 100 may be divided into sections for holding components that require differing levels of access in use. For example, the top section behind doors 150 may be configured to hold network line cards 210, which may need to be accessed relatively frequently. The bottom section 140 may be configured to hold a power supply, which does not need to be accessed as often. While two sections have been described and shown, in alternative examples, enclosure 100 may be divided into one section or more than two sections.

Figure 5:
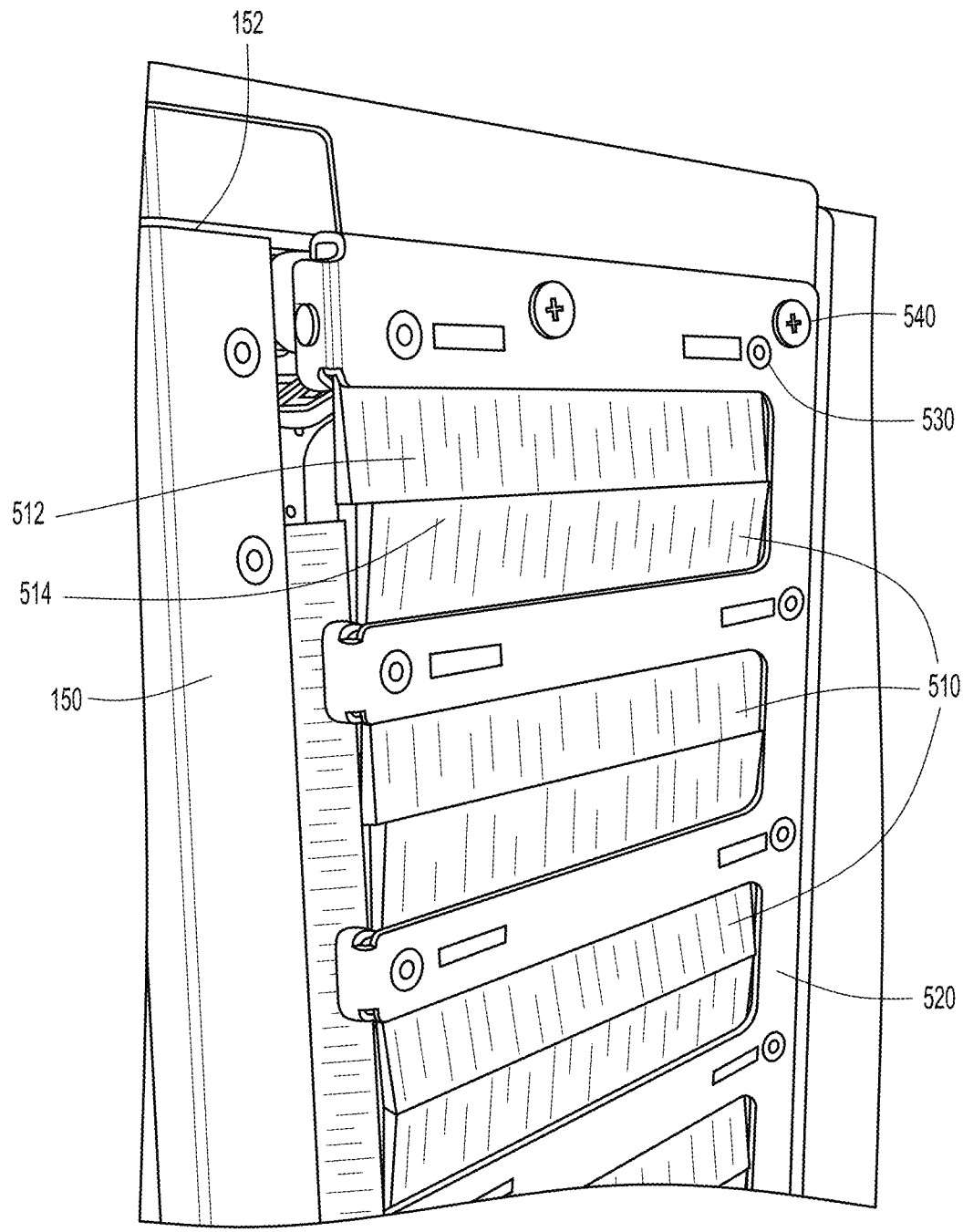
FIG. 5 is a close up view of side brushes of the enclosure with doors attached and closed.
Figure 6:
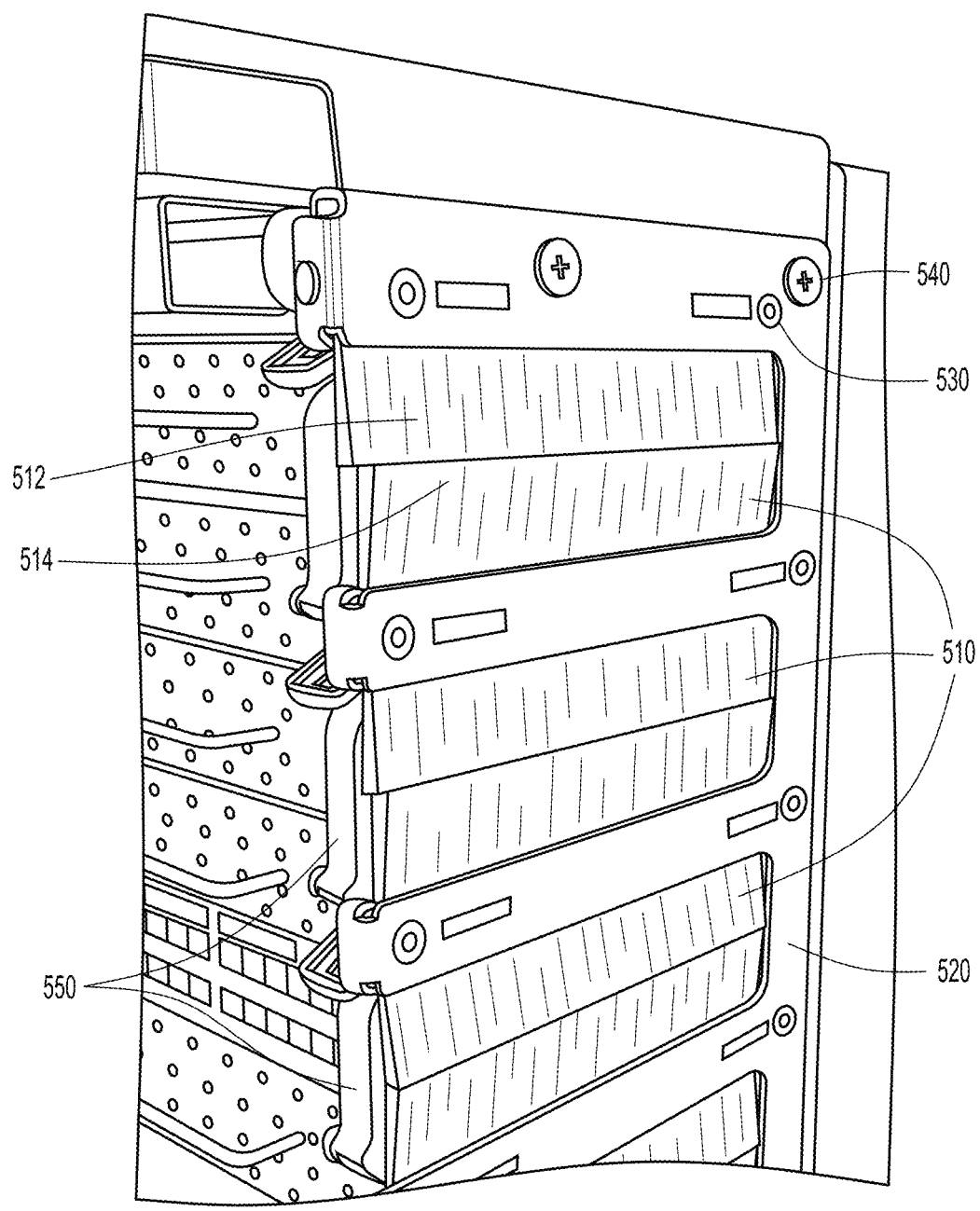
FIG. 6 is a close up view of side brushes of the enclosure with doors removed.
Figure 10:
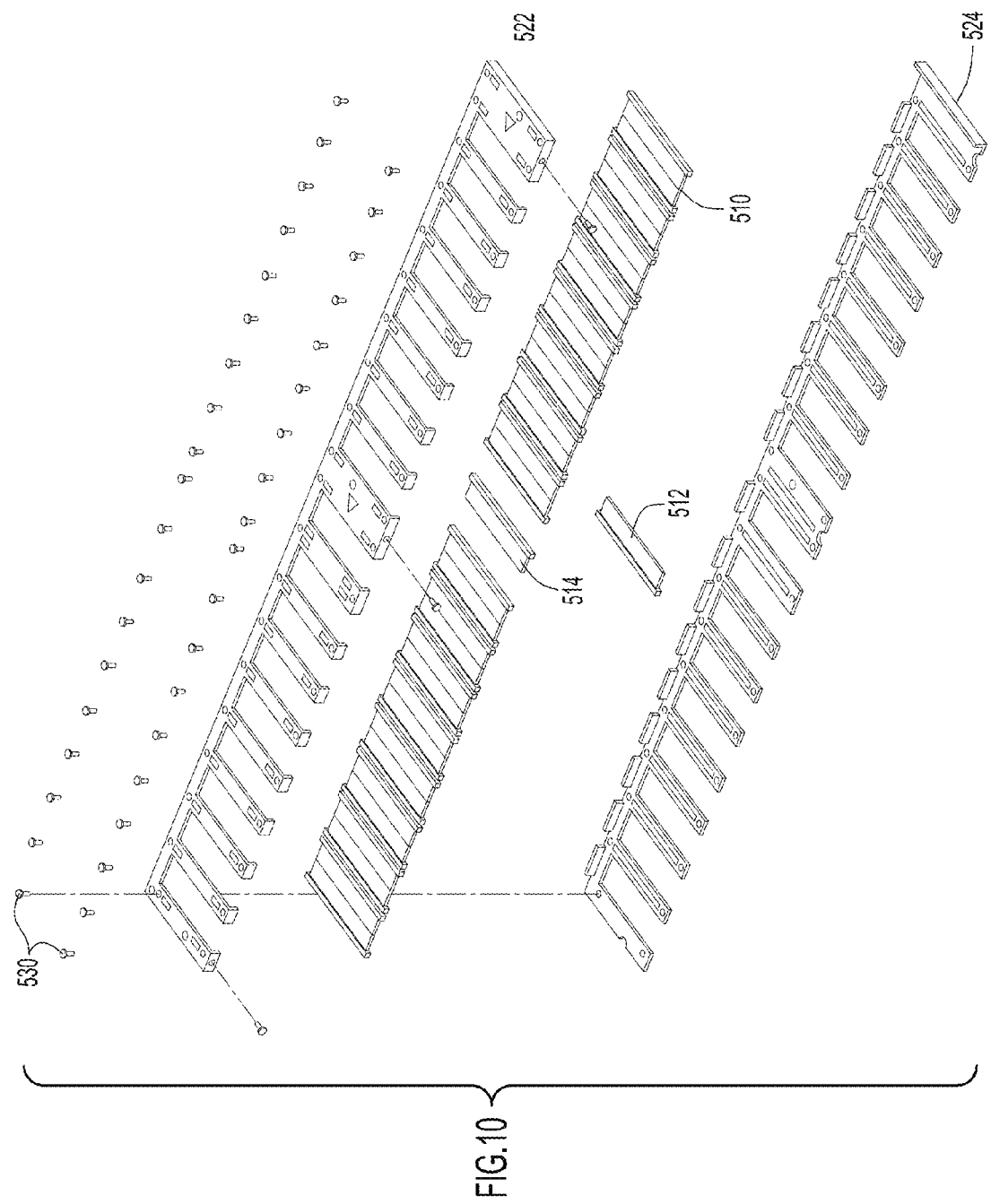
FIG. 10 is an exploded view of the side brushes and illustrating the support structure.
Figure 11:
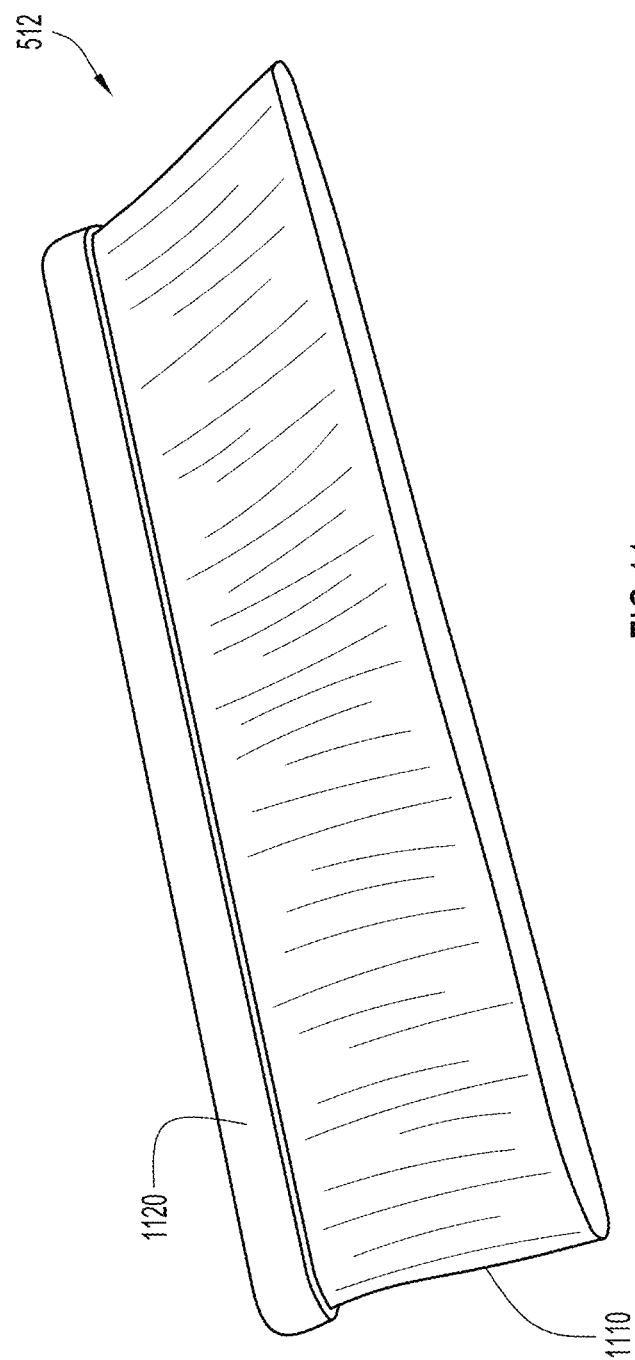
FIG. 11 illustrates a single side brush.

Referring now to FIGS. 5 and 6, a close up view of cable management system 160 is shown with the adjacent door 150 attached (FIG. 5) and removed (FIG. 6). Cable management system 160 includes a plurality of side brush filters 510 held together by frame 520. Each side brush filter 510 comprises a pair of side brushes 512, 514 facing each other. As further shown in FIG. 10, one example of frame 520 is separated into a right half 522 and a left half 524. The two halves of frame 520 are held together by fasteners 530 (e.g., rivets, etc.). The entire frame is attached to enclosure 100 with fasteners 540 (e.g., screws, etc.). In another example, individual side brushes 510 may be attached directly to enclosure 100. Plastic clips 550 can be opened to allow access to the side of each side brush filters 510. FIG. 11 illustrates one side brush 512 comprising filaments 1110 encased at one end by rail 1120. Filaments 1110 may be made of nylon filaments or other similarly resilient material (e.g., polyethylene, polypropylene, etc.). Rail 1120 may be made of a suitable durable material (e.g., metal, plastic, etc.).

Figure 7:
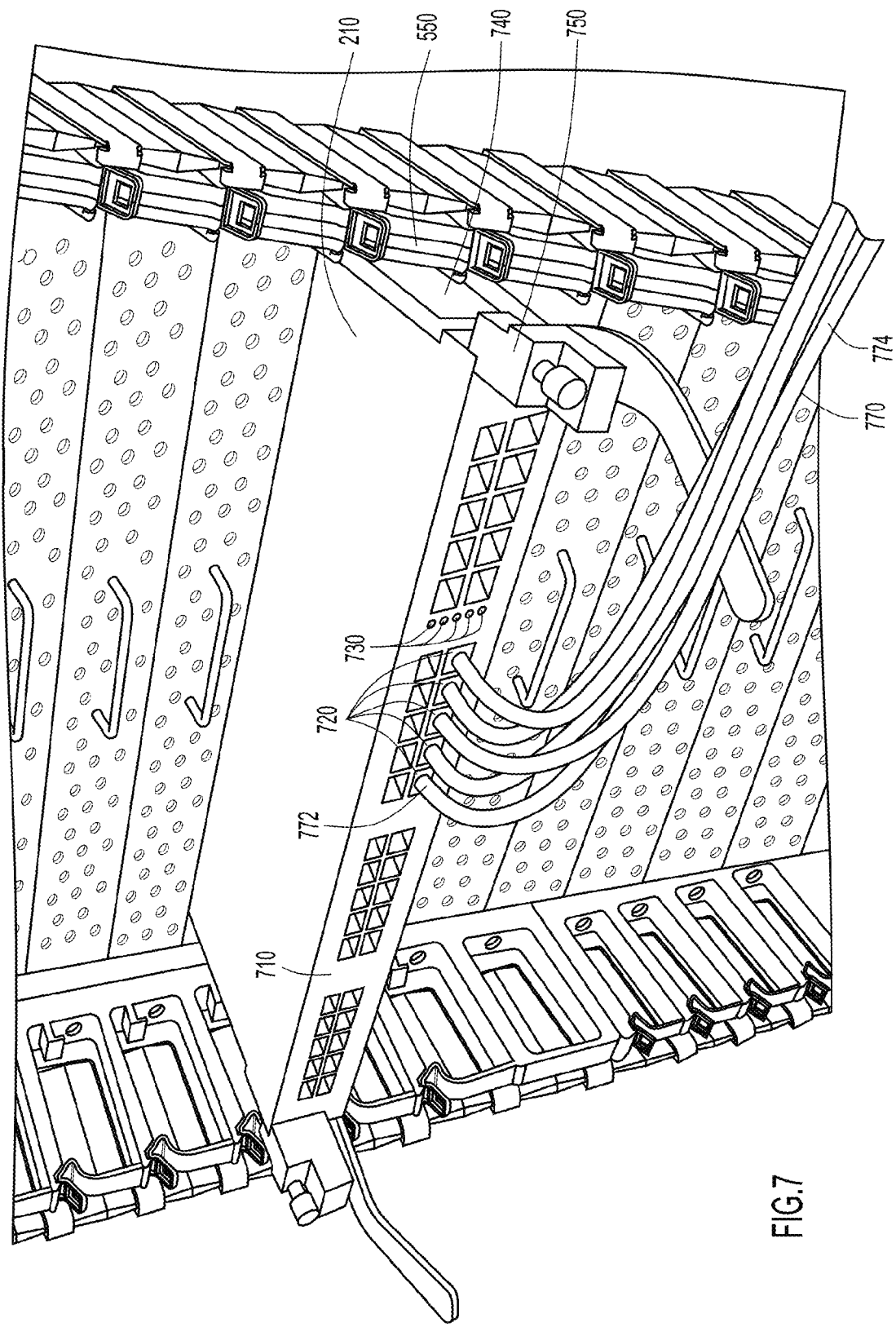
FIG. 7 illustrates a network line card partially installed in the enclosure with network cables attached.

Referring now to FIG. 7, line card 210 is shown partially installed in a rack of enclosure 100. Line card 210 is only halfway inserted into a line card cage in enclosure 100 to allow easy access to the ports 720 on front face 710. Holes 730 allow air to flow through the face of line card 210 and cool the electronic components in the enclosure. Line card 210 is supported on its sides 740 by mounting brackets attached to enclosure 100. Locking mechanism 750 secures line card 210 into position after network cables 770 have been attached and line card 210 is fully installed into the line card cage of enclosure 100. Cables 770 may have sensitive connectors on the ends 772 that couple to ports 720 of line card 210. The middle portion 774 of cables 770 has a robust insulation layer that is not as sensitive to handling as ends 772.

Figure 8:
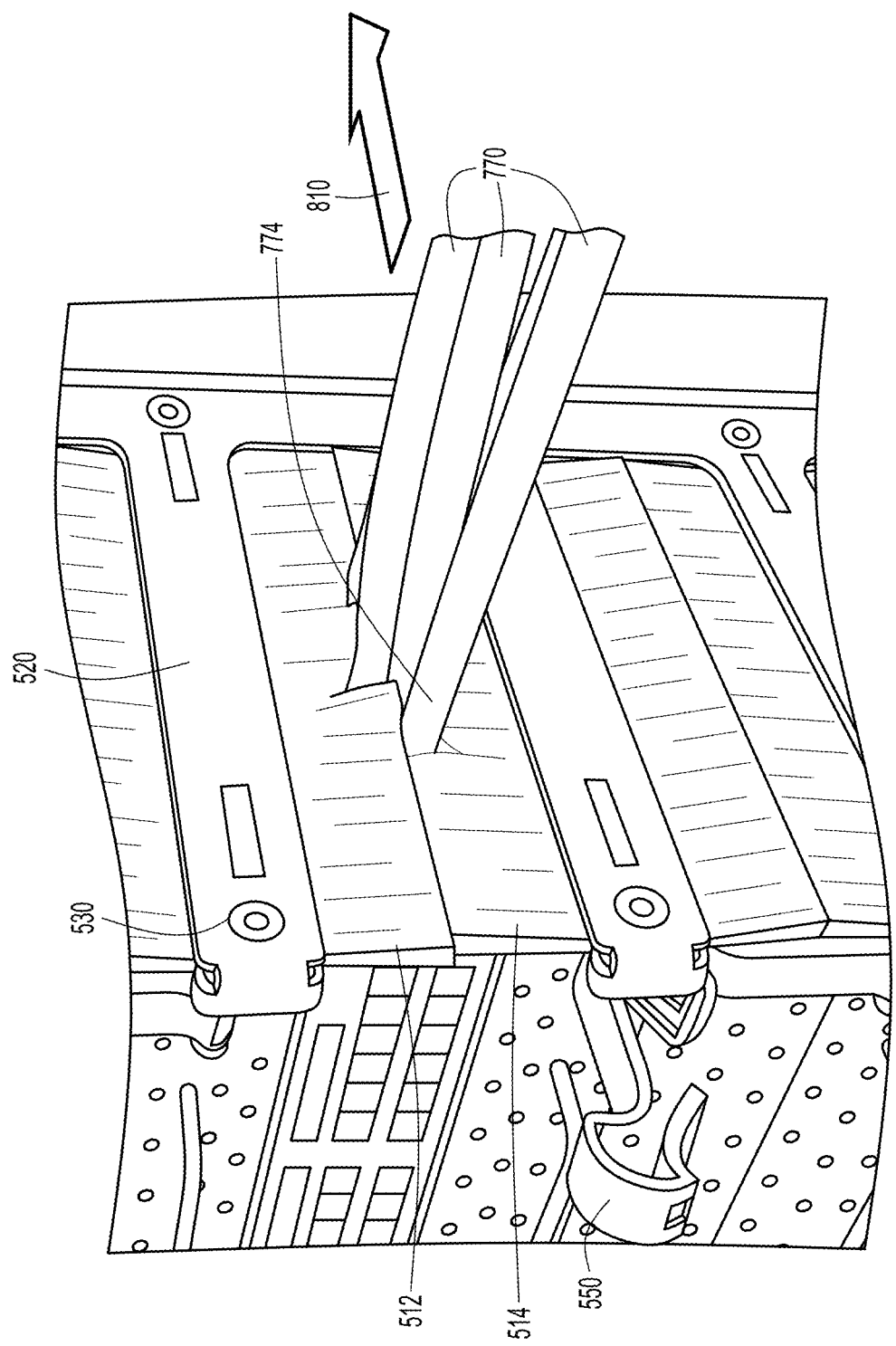
FIG. 8 is an illustration of network cables sliding into the side brushes.
Figure 9:
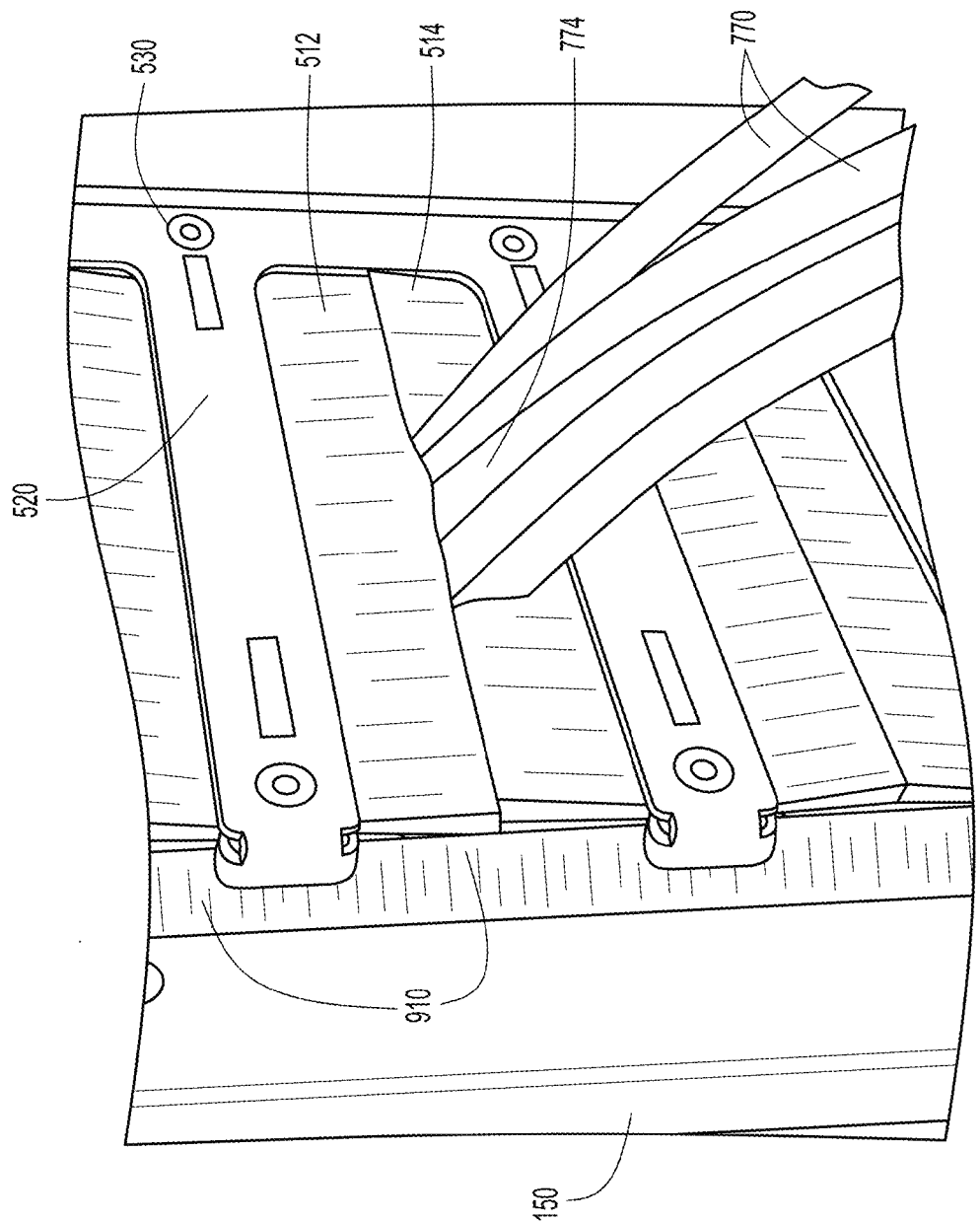
FIG. 9 is an illustration of network cables coming out through the side brushes of the enclosure with its doors closed.

FIGS. 8 and 9 illustrate the completion of the process of installing line card 210 in enclosure 100. In one example, after all of the cable ends 772 have been inserted into their respective ports 720, line card 210 is slid fully into enclosure 100 and locked with locking mechanism 750. One of the plastic clips 550 over a side brush filter 510 is opened and cables 770 are slipped in the direction indicated by arrow 810. Since ends 772 are coupled to ports 720, only the middle portion 774 of cables 770 touch side brushes 512 and 514. After cables 770 are surrounded by the filaments of side brushes 512 and 514, plastic clip 550 is closed providing a more robust way of ensuring cables 770 do not come free from side brush filter 510. FIG. 9 shows enclosure 100 after front door 150 is re-installed, with cables 770 exiting enclosure 100 through side brush filter 510. Long filaments 910 are attached to door 150 such that filaments 910 cover the open end of side brush 510, providing additional sealing. These additional filaments 910 may be made of similar material as side brush filaments 1110.

Referring again to FIG. 10, an example is shown of an array of side brush filters 510 mounted in u-shaped channels, such as may be used for cable management system 160. Individual side brushes 512 and 514 line up across from each other to form side brush filter 510. The individual side brushes 512, 514, shown in FIG. 11, are made from stiff filaments 1110, and conform to cables 770 that are passed through them. In the side brushes 512 and 514 that are aligned across from each other to form side brush filter 510, the ends of filaments 1110 come together to form an air and dust barrier. A plurality of side brush filters 510 mount along a common frame 520 allowing easy installation on enclosure 100. Side brush filters 510 may be secured to the mounting frame by fasteners 530 (e.g., rivets, bolts, screws, etc.), or they may be sandwiched between the two halves of frame 520 with fasteners 530 holding side brush filters within frame 520.

Figure 12:
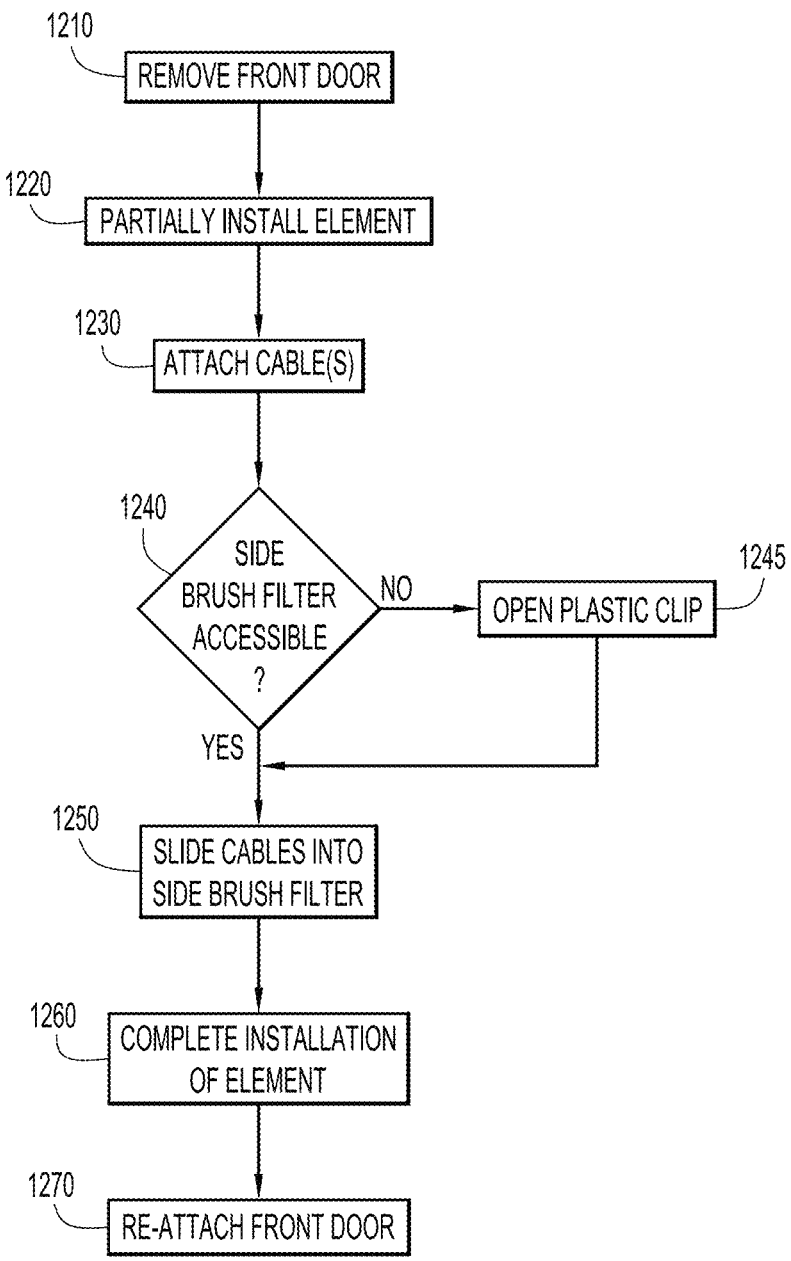
FIG. 12 is a flowchart of a process for installing network line cards in the enclosure, according to techniques presented herein.

Referring now to FIG. 12, an example of installing a heat generating element, such as line card 210, is provided. Reference is also made to FIGS. 1 and 6-9 for purposes of the description of FIG. 12. In step 1210, front door 150 is removed from enclosure 100. A heat generating element, such as line card 210, is partially installed in step 1220. Partially installing line card 210 provides for easy visual access to all ports 720, allowing cables 770 to be coupled to ports 720 in step 1230. If the side of side brush filter 510 is closed by plastic clip 550, as determined in step 1240, then plastic clip is opened at step 1245 allowing access to the side of brush filter 510. In step 1250, cables 770 are slid into the open side of brush filter 510 (i.e., between brush 512 and 514). Cables 770 may be slid into brush filter 510 all at once after being coupled to ports 720, or one at a time after each one is coupled to its respective port 720. Additionally, multiple side brush filters 510 are provided, and cables 770 may be slid into one or several side brush filters 510. After all cables 770 have been coupled to their respective ports 720, and slid into brush filter 510, installation of line card 210 is completed at step 1260. In one example, completing the installation includes closing plastic clips 550, sliding line card 210 completely into the rack of enclosure 100, and securing line card 210 with locking mechanism 750. To complete the process, front door 150 is re-installed at step 1270.

In summary, and with reference again to FIGS. 1, 2, and 5, when enclosure 100 is equipped with a Network Equipment Building System (NEBS) compliant filtration system, foam filters 158 are attached to the inner surface of doors 150 and side brush filters 510 are attached as part of side cable management system 160. Side brush filters 510 may be attached on one or both sides 130 of enclosure 100 adjacent to front doors 150. The filtration system also provides long brushes 910 that are attached to the side edge of doors 150 to provide additional sealing in the gap between doors 150 and side cable management system 160. Replaceable front foam filters 158 are snapped into the hardware located on inside of door 150 to provide simple, tool-less installation.

Front doors 150 have spring-loaded hinges 152 for easy and quick removal during line card 210 installation and they provide an easy attachment point for front foam filters 158. The open-front design of side brush filters 510 allows the entire network cable bundle 770 to be pre-plugged into line cards 210 and easily slide into the brush filament of side brushes 510. The entire front side of side brush 510 is completely open for cable bundles 770 to slide in easily during the installation of line card 210. This allows all network cables 770 to be plugged in to the ports 720 of line cards 210 prior to sliding the whole thing into enclosure 210. In one example, the side brushes are composed of short Nylon brushes 1110 (pre-mounted on u-channel metal rails 1120) sandwiched between two sheet metal brackets 522 and 524 with open front by using flat head rivets 530. The metal u-channel rail 1120 to which the Nylon filaments 1110 are attached also act as stiffeners to increase the overall rigidity of the design. This relatively simple but effective design provides a very rigid platform to which Nylon brushes 1110 are securely attached to the sheet metal parts while still allowing large network cable bundles 770 to slide in from the front. In this example, the entire cable management system 160, including the two outer sheet metal thickness, is only about ¼" thick to provide a very clean and slim design. In addition to providing the NEBS-compliant air filtration, this system also solves the stringent government Federal Information Processing Standard (FIPS) compliance requirement. The FIPS requires a complete visual barrier on an enclosure in a government environment. Its main purpose is to prevent any bystanders from being able to see or identify any internal components and also provide evidence of tampering. The lockable doors along with front foam filter and side brush kit are more than sufficient to meet this stringent FIPS compliance requirement on enclosure 100.

Straight front-to-back airflow is a relatively new concept in the data center or telecom industry, and existing enclosures do not provide complete air filtration while still providing cable routing to the line cards. As described above, flat foam filters can be placed a certain distance away from the line cards' surfaces to provide the majority of air filtration that is going into the enclosure. Nylon filament brush, such as has been used by other industries to shield against debris and dust, has been used as a cable management solution. However, all existing brush designs used in the prior cable management systems have completely enclosed perimeter/walls around the brush, which only allows the tip of cables to pass through, but does not allow a cable bundle to be slid in. If the both of the cable's ends are already plugged in, it is impossible for the cable to be slid into the brush.

The above description is intended by way of example only. Any material described is only an example of a material that may be used. Other materials can be substituted without leaving the scope of the present invention. It is also to be understood that terms such as "left," "right," "top," "bottom," "front," "rear," "side," "height," "length," "width," "upper," "lower," "interior," "exterior," "inner," "outer" and the like as may be used herein, merely describe points or portions of reference and do not limit the present invention to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment of the invention.

What is claimed is:

1. An apparatus comprising:
   an enclosure comprising at least one removable, perforated front door on a front side of the enclosure, and a perforated rear wall opposite the front side of the enclosure;
   at least one filter mounted on the perforated front door and through which air is to be drawn through;
   a plurality of first mounting brackets configured to mount a plurality of heat generating elements within the enclosure; and
   a plurality of side brush filters, each of the plurality of side brush filters including a second mounting bracket with an open side configured to allow at least one cable to slide into the side brush filter.

2. The apparatus of claim 1, wherein the perforated rear wall is a rear surface of the enclosure.

3. The apparatus of claim 2, wherein the rear surface is configured to mount at least one fan.

4. The apparatus of claim 1, wherein the heat generating elements are network line cards.

5. The apparatus of claim 4, wherein the first mounting brackets are line card cages.

6. The apparatus of claim 1, further comprising a plurality of stiff filaments mounted on the at least one front door, and configured to cover the open side of each of the side brush filters.

7. The apparatus of claim 1, wherein each of the plurality of side brush filters is configured to allow at least one cable to slide into the side brush filter, such that only a middle portion of the cable makes contact with the side brush filter, and end portions of the cable do not make contact with the side brush filter.

8. The apparatus of claim 1, wherein the enclosure filters air entering the enclosure in compliance with Network Equipment Building System (NEBS) standards.

9. The apparatus of claim 1, wherein the enclosure with the at least one front door closed is configured to form a visual barrier that ensures the plurality of heat generating elements are not visible from outside the enclosure, and such that the enclosure complies with Federal Information Processing Standards (FIPS).

10. A method comprising:
    removing a perforated front door of an enclosure;
    partially installing a heat generating element into the enclosure;
    attaching at least one cable to the heat generating element;
    sliding the at least one cable into a side brush filter mounted on the enclosure, wherein the at least one cable is slid into an open side of the side brush filter;
    completing the installation of the heat generating element; and
    re-installing the perforated front door.

11. The method of claim 10, wherein attaching at least one cable to the heat generating element comprises attaching at least one network cable to a network line card.

12. The method of claim 11, wherein completing the installation of the heat generating element comprises sliding the network line card completely within the enclosure, such that the re-installed perforated front door can be closed.

13. The method of claim 10, wherein sliding comprises sliding the at least one cable so that only a middle portion of the at least one cable makes contact with the side brush filter.

14. The method of claim 13, wherein sliding the at least one cable comprises sliding the middle portion of the at least one cable into the open side of the side brush filter, such that end portions of the at least one cable do not make contact with the side brush filter.

15. An apparatus comprising:
    an enclosure comprising at least one removable, perforated front door on a front side of the enclosure, and a perforated rear wall opposite the front side of the enclosure;
    at least one filter mounted on the perforated front door and through which air is to be drawn through;
    a plurality of racks configured to mount a plurality of network line cards within the enclosure; and
    a plurality of side brush filters mounted on a common frame;
    wherein each of the plurality of side brush filters is configured to allow a bundle of network cables to exit the enclosure while substantially preventing dust from entering the enclosure.

16. The apparatus of claim 15, wherein the enclosure is configured to mount a fan to draw air through the enclosure.

17. The apparatus of claim 15, wherein the perforated front door is removable from the enclosure with at least one spring-loaded hinge.

18. The apparatus of claim 15, further comprising a power supply portion that is not accessible from the at least one perforated front door.

19. The apparatus of claim 15, further comprising a plurality of securing clips corresponding to the plurality of side brush filters.

20. The apparatus of claim 1, wherein the perforated front door is removable from the enclosure with at least one spring-loaded hinge.

* * * * *